US010010000B2

(12) United States Patent
Chamberlin et al.

(10) Patent No.: US 10,010,000 B2
(45) Date of Patent: Jun. 26, 2018

(54) MANUFACTURING A PRODUCT USING A SOLDERING PROCESS

(71) Applicant: INTERNATIONAL BUSINESS MACHINES CORPORATION, Armonk, NY (US)

(72) Inventors: Bruce J. Chamberlin, Endicott, NY (US); Andreas Huber, Boeblingen (DE); Harald Huels, Boeblingen (DE); Thomas-Michael Winkel, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/158,831

(22) Filed: May 19, 2016

(65) Prior Publication Data

US 2016/0270240 A1 Sep. 15, 2016

Related U.S. Application Data

(63) Continuation of application No. 14/282,095, filed on May 20, 2014, now Pat. No. 9,398,702.

(30) Foreign Application Priority Data

May 22, 2013 (GB) .................................. 1309211.9

(51) Int. Cl.
*B23P 19/00* (2006.01)
*H05K 3/34* (2006.01)
(Continued)

(52) U.S. Cl.
CPC ......... *H05K 3/3494* (2013.01); *B23K 1/0016* (2013.01); *B23K 11/002* (2013.01);
(Continued)

(58) Field of Classification Search
CPC .. H01L 2224/04042; H05K 2203/1115; H05K 2203/163; H01R 43/0256;
(Continued)

(56) References Cited

U.S. PATENT DOCUMENTS 4,914,267 A * 4/1990 Derbyshire ............ B23K 1/002
219/85.1
6,079,603 A 6/2000 Smegal
(Continued)

FOREIGN PATENT DOCUMENTS

WO 0153031 A1 7/2001
WO 2003062136 A3 7/2003

OTHER PUBLICATIONS

Search Report for GB1309211.9, dated Nov. 19, 2013, pp. 1-3.
(Continued)

*Primary Examiner* — Thiem Phan
(74) *Attorney, Agent, or Firm* — Steven Chiu; Matthew M. Hulihan; Heslin Rothenberg Farley & Mesiti PC (57) ABSTRACT

A system for manufacturing a product includes a mating connector connected to solder pins to provide an electrical conducting path, the solder pins being aligned against solder pads so that each solder pin is thermally and electrically connected to its corresponding solder pad by a solder paste bead. The system also includes a controller to adjust electrical resistive heating of a solder paste bead during a soldering process according to a temperature of the solder paste bead. A method of manufacturing a product includes aligning the solder pins against the solder pads, connecting the mating connector to the solder pins, and heating a solder paste bead by an electrical resistive heating, the solder paste bead undergoing a soldering process, where a temperature of
(Continued)

the solder paste bead is being evaluated and the electrical resistive heating is adjusted according to the temperature of the solder paste bead.

16 Claims, 5 Drawing Sheets

(51) Int. Cl.
  *B23K 1/00* (2006.01)
  *B23K 11/00* (2006.01)
  *H05K 1/11* (2006.01)

(52) U.S. Cl.
  CPC .............. *H05K 1/111* (2013.01); *H05K 1/115* (2013.01); *H05K 3/3421* (2013.01); *H05K 2203/1115* (2013.01); *H05K 2203/163* (2013.01); *Y10T 29/49124* (2015.01); *Y10T 29/49126* (2015.01); *Y10T 29/53174* (2015.01)

(58) Field of Classification Search
  CPC ......... Y10T 29/49126; Y10T 29/49144; Y10T 29/53174
  USPC ......... 29/739, 729, 740, 787, 825, 829, 830, 29/831, 846; 219/85.13, 121.63; 257/203, E23.086, E23.103
  See application file for complete search history.

(56) References Cited

U.S. PATENT DOCUMENTS

| 6,091,044 | A | | 7/2000 | Larranaga et al. |
| 6,097,603 | A | * | 8/2000 | Edwards ............. H01L 23/3672 165/80.3 |
| 6,369,345 | B1 | | 4/2002 | Zaloga et al. |
| 6,513,701 | B2 | * | 2/2003 | Mead .................. B23K 1/0053 219/121.63 |
| 2014/0345123 | A1 | | 11/2014 | Chamberlin et al. |
| 2015/0249096 | A1 | | 9/2015 | Lupino et al. |

OTHER PUBLICATIONS

Restriction Requirement in U.S. Appl. No. 14/282,095, dated Feb. 17, 2016, pp. 1-6.
Notice of Allowance in U.S. Appl. No. 14/282,095, dated Apr. 21, 2016, pp. 1-10.

* cited by examiner

MANUFACTURING A PRODUCT USING A SOLDERING PROCESS

CROSS-REFERENCE TO RELATED APPLICATIONS

This application claims priority to U.S. patent application Ser. No. 14/282,095 filed May 20, 2014 and entitled "MANUFACTURING A PRODUCT USING A SOLDERING PROCESS", which claims priority to United Kingdom patent application number 1309211.9, filed May 22, 2013, both of which are hereby incorporated by reference herein in their entirety.

BACKGROUND

A lot of electronic devices are assembled by soldering a number of electronic parts like discrete elements and/or integrated circuits on a printed circuit board. Solder paste beads are printed on metallization pads of the printed circuit board. Afterwards electronic parts are placed on the printed circuit board in a way that corresponding soldering pins or metallization pads of the electronic parts are connected by the solder paste beads with the metallization pads of the printed circuit board. Afterwards the electronic device is heated, so that the solder paste beads undergo a soldering process, solder particles of the solder paste beads melt, coalesce, and build continuous connections between the matching metallization pads of the printed circuit board and the soldering pins or the metallization pads of the electronic components. Modern soldering processes demand close following of time temperature profiles provided by electronic part and/or printed circuit board and/or solder paste vendors throughout the soldering process in order to achieve desired properties of the solder paste beads.

BRIEF SUMMARY

One embodiment provides for a method of manufacturing a product comprising a first part and a second part. The first part comprises solder pins and the second part comprises solder pads. Each of the solder pins has the matching solder pad. Each of the solder pads is covered by a matching solder paste bead. The method comprises: aligning the solder pins against the solder pads in a way that each pair of the solder pin and the matching solder pad is thermally and electrically connected by the matching solder paste bead; connecting a mating connector to the first part, wherein the mating connector is operable for providing a part of an electrical conducting path; and heating at least one of the solder paste beads by an electrical resistive heating, wherein the electrical resistive heating is generated by an electrical current flowing through the electrical conducting path, wherein said solder paste bead undergoes a soldering process facilitated by the electrical resistive heating, wherein a temperature of said solder paste bead is being evaluated, wherein the electrical resistive heating is adjusted according to the temperature of said solder paste bead.

Another embodiment provides for a system for manufacturing a product comprising a first part and a second part. The first part comprises solder pins and the second part comprises solder pads. Each of the solder pins has the matching solder pad. Each of the solder pads is covered by a matching solder paste bead. The system comprises: a mating connector, wherein the mating connector is operable for providing a part of an electrical conducting path when the mating connector is connected to the first part, wherein the electrical conducting path is used for a flow of an electrical current, wherein the electrical current is used for generation of an electrical resistive heating, wherein the electrical resistive heating is used to facilitate a soldering process of at least one solder paste bead wherein the solder pins are aligned against the solder pads in a way that each pair of the solder pin and the matching solder pad is thermally and electrically connected by the matching solder paste bead; a sensor to facilitate evaluation of a temperature of the solder paste bead during the soldering process facilitated by the electrical resistive heating; and a controller to adjust the electrical resistive heating of said solder paste bead during the soldering process facilitated by the electrical resistive heating according to the temperature of said solder paste beads.

BRIEF DESCRIPTION OF THE SEVERAL VIEWS OF THE DRAWINGS

One or more aspects will be readily understood by the following detailed description in conjunction with the accompanying drawings.

DETAILED DESCRIPTION

One or more aspects are based on the following:

A solder pin is a metallic rod of an arbitrary shape incorporated into a body of a part of a product. The metallic rod has a least one surface used for soldering to another part of a product.

A solder pad is a metallization pad of an arbitrary shape on a surface of a part of a product. A surface of the solder pad is used for soldering to another part of a product.

A contact pad is a metallization pad of an arbitrary shape on a surface of a part of a product. A surface of the solder pad is used for making temporary electrical connection to the part of a product.

A solder paste is a compound comprising powdered metal solder suspended in a thick medium called flux. Flux is added to act as a temporary adhesive, holding (if necessary) different parts of a product together until a soldering process is started.

A solder paste bead is a predetermined volume of a solder paste. Solder paste beads are placed between matching soldering surfaces of different parts of a product. The volume of the solder paste bead is determined among other parameters according to geometrical areas of the matching soldering surfaces of the different parts of the product.

A soldering process is a process, wherein solder particles of a solder paste melt, coalesce, and build continuous connection between matching soldering surfaces of different parts of a product.

A time domain reflectometry is employed for assessment of quality electrical conducting paths. An electrical pulse is sent from one end of the electrical conducting path along the electrical conducting path. If the electrical conducting path is of a uniform impedance, the entire pulse will be transmitted along the electrical conducting path and it will be partially reflected only from another end of the electrical conducting path. Any impedance discontinuities will cause additional reflections of the incident signal to be sent back towards a source of the electrical pulse connected to the end of the electrical conducting path. These additional reflections are caused among other factors by soldering parasitics and/or imperfections and/or defects, if the electrical conducting path comprises parts of a product soldered together.

A proportional-integral-derivative control algorithm is based on a generic control loop feedback. An error value representing a difference between a measured process variable and a desired set point is calculated. For instance it can be a difference between a temperature of a solder paste bead and a specified temperature throughout a soldering process. The process control inputs are adjusted in order to minimize the error value. The algorithm involves three separate constant parameters: the proportional, the integral and derivative values, denoted P, I, and D. Heuristically, these values can be interpreted in terms of time: P depends on the present error, I on the accumulation of past errors, and D is a prediction of future errors, based on current rate of change. The weighted sum of these three actions is used to adjust the process via a control element such as for instance an electrical current flowing through an electrical resistive heating element, wherein a heat generated by the electrical resistive element is provided to the solder paste bead.

One or more aspects provide for embodiments that provide effective high quality manufacturing of a product using a soldering process. It should be appreciated that the one or more aspects can be implemented in numerous ways, including as a system, an apparatus, and a method.

One or more aspects provide an effective and controllable execution of a soldering process of electronic parts. Providing a time temperature profile of electronic parts and/or printed circuit boards and/or solder paste beads according to vendor recommendations and/or results of the soldering process optimization throughout the soldering process is for achieving desired properties of solder connections and avoiding damage of the electronic parts and/or the solder connections and/or the printed circuit boards during or after soldering process. When a soldering process is performed in a soldering oven, the time temperature profile of the solder paste beads and/or the electronic parts and/or printed circuit boards can be monitored by measuring the temperature of air in the soldering oven. This approach would work if a change in the air temperature in the soldering oven is slow enough to provide uniform temperature over all solder paste beads and electronic parts and circuit boards. However it is often not the case because of big diversity of thermal properties of the electronic parts and/or the solder paste beads and/or the printed circuit boards like heat conduction, infrared emissivity, specific heat capacity, etc. For instance, the solder paste beads being in contact with massive metal parts might have lower time temperature profiles throughout the soldering process in comparison with the solder paste beads being in contact only with thin metallization pads. In the other words, the soldering process might be too short to warm up the massive metal parts up to the required temperature. One or more aspects address this. In particular, one or more aspects enable providing heat individually to each solder paste bead with simultaneous evaluation of the temperature of each solder paste bead.

One or more aspects are for lead free soldering processes. Solder materials used in these processes are more refractory and require higher soldering temperatures in comparison with lead based soldering processes. Further, one or more aspects are for a surface mount technology, wherein the solder connections perform not only a function of electrical connection between the electrical parts and the printed circuit boards, but provide a mechanical fixation of the electrical parts to the printed circuit boards. Non-uniform heating of the solder paste beads and/or the electronic parts and/or the printed circuit boards throughout the soldering process may result in building up mechanical stresses in the electronic parts and/or printed circuit boards and/or the solder connections connecting the electronic parts and the printed circuit boards. In return the mechanical stresses may result in failures of the electronic parts and/or the printed circuit boards and/or the solder connections.

Several exemplary embodiments for a system, an apparatus, and a method for manufacturing of a product will now be discussed. It will be apparent to those skilled in the art that the one or more aspects may be practiced without some or all specific details set forth therein.

Figure 1:
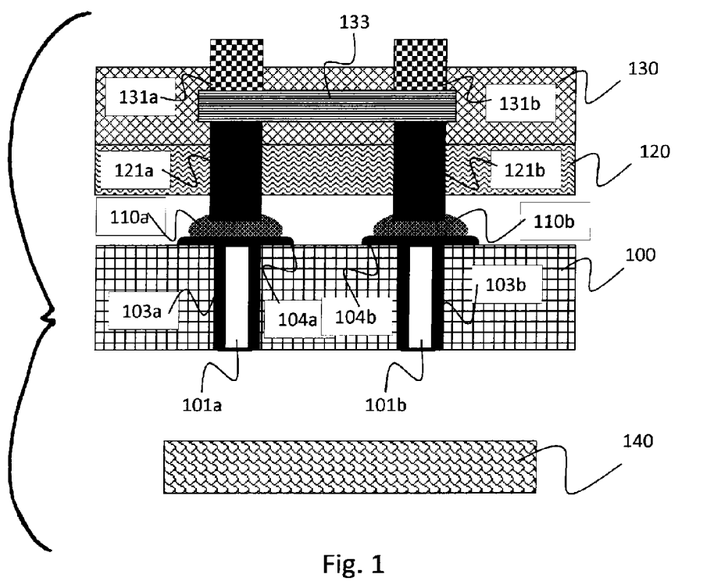
FIG. 1 is a cross-section of a product and a mating connector, in accordance with an embodiment of the present invention.

FIG. 1 illustrates a first part 120 of a product aligned against a second part 100 of the product and a system for soldering the first part to the second part. The system comprises a mating connector 130. The mating connector 130 can be connected to the first part. The system can further comprise an infrared sensor 140. The first part comprises a solder pin 121*a*, another solder pin 121*b*. The second part comprises a metallized electrical via connection 101*a*, another metallized electrical via connection 101*b*, a solder pad 104*a*, another solder pad 104*b*, a top surface and a bottom surface. The metallized electrical via connection 101*a* comprises a hole having an opening on the top surface of the second part and another opening on the bottom surface of the second part. Sidewalls of the hole are covered with a metallization 103*a*. The another metallized electrical via connection 101*b* comprises another hole having an opening on the top surface of the second part and another opening on the bottom surface of the second part. Sidewalls of the another hole are covered with another metallization 103*b*. The opening of the hole on the top surface is covered by a solder pad 104*a* being electrically and thermally connected with the metallization 103*a*. The opening of the another hole on the top surface of the second part is covered by another solder pad 104*b* being electrically and thermally connected with the another metallization 103*b*. The solder pin 121*a* matches the solder pad 104*a*. The another solder pin 121*b* matches the another solder pad 104*b*. The solder pad 104*a* is covered by a solder paste bead 110*a* being in thermal and electrical contact with the solder pad 104*a* and the solder pin 121*a*. The another solder pad 104*b* is covered by another solder paste bead 110*b* being in thermal and electrical contact with the another solder pad 104b and the another solder pin 121b. The mating connector comprises an electrical resistive heating element 133 being in thermal contact with the solder pins 131a and 131b when the mating connector is connected to the first part. The mating connector further comprises an electrical connector 131a of the electrical resistive heating element and another electrical connector 131b of the electrical resistive heating element.

In another embodiment the via connections 101a and 101b can have openings on both surfaces of the second part that are covered or not covered by corresponding metallization/solder pads being in thermal and electrical connection with corresponding metallizations 103a and 103b as shown in the FIG. 1.

An electrical resistive heating is generated in the electrical resistive heating element when an electrical current flows through an electrical conducting path comprising the electrical connectors of the electrical resistive heating element and the electrical resistive heating element. In order to reduce unnecessary/parasitic heating of the mating connector, in one embodiment, the electrical resistance of the electrical resistive heating element is higher than a sum of electrical resistances of the electrical connectors 131a and 131b. A heat generated by the electrical resistive heating flows through solder pins 121a and 121b to the solder paste beads 110a and 110b. The heat facilitates a soldering process. The heat further flows to the bottom surface of the second part via the solder pads and the metallized electrical via connections. The infrared sensor 140 is located abreast the hole openings of the metallized electrical via connections on the bottom surface of the second part. The infrared sensor is operable for registering infrared emission of metallization of the metallized electrical via connections. The registered infrared emission values can be converted into a temperature of the solder paste beads and/or solder pins and/or solder pads by modeling heat propagation from the electrical resistive element to the metallized electrical via connections and taking into account an infrared emissivity factor of metallization of the metallized electrical via connection. Alternatively the registered infrared emission values can be converted into the temperature of the solder paste beads and/or solder pins and/or solder pads by performing a calibration process during the soldering process. In this case at least one of the solder paste beads and/or solder pins and/or solder pads is thermally connected to a temperature sensor. The calibration is performed by correlating the temperature of the solder paste bead or the solder pin or the solder pad measured by the temperature sensor with the registered infrared emission values throughout the soldering process. The latter method of evaluation of the solder paste bead or the solder pin or the solder pad temperature is for high volume manufacturing. The solder paste bead and/or solder pin and/or solder pad temperatures can be calibrated by running a few test batches. Afterwards these temperatures can be measured exclusively by employing the infrared sensor in the high volume manufacturing process.

Figure 2:
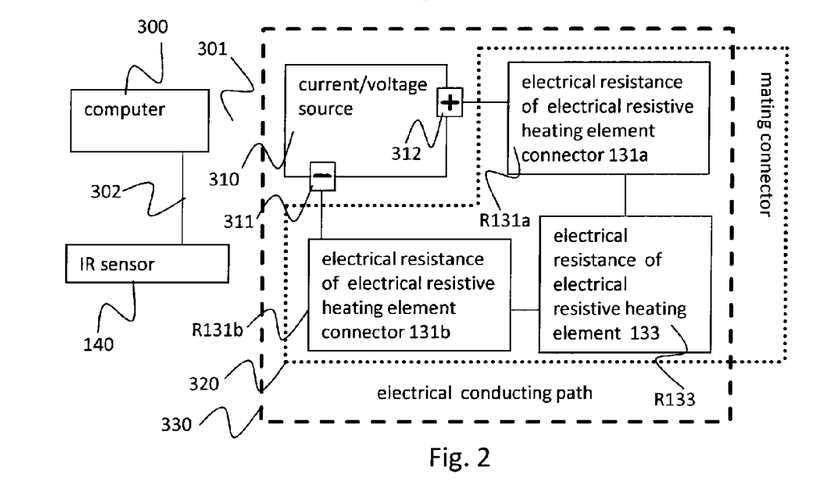
FIG. 2 is an electrical scheme representing an electrical conductive path, in accordance with an embodiment of the present invention.

FIG. 2 illustrates an electrical scheme comprising elements represented on the FIG. 1. A closed loop of the electrical conducting path is within a dashed contour 330. Electrical resistors corresponding to components of the mating connector 130 are within a doted contour 320. The closed loop of the electrical conducting path comprises the following elements connected in series: a current/voltage source 312, an electrical resistor R131a representing electrical resistance of the electrical connector 131a, an electrical resistor R133 representing electrical resistance of the electrical resistive heating element 133, an electrical resistor R131b representing electrical resistance of the another electrical connector 131b. An output terminal 312 of the current/voltage source is connected to the electrical resistor 131a. Another output terminal 311 of the current/voltage source is connected to the electrical resistor 131b. The current/voltage source is operable for setting a current or a voltage at the output terminals 311 and 312. A computer 300 is connected to the current/voltage source via a connection 301. The computer 300 is operable for sending commands to the current/voltage source to set at the output terminals a current value or a voltage value according to a program being executed on the computer 300. A connection 301 between the computer 300 and the current/voltage source is operable for transmitting said commands. The computer 300 is further operable for receiving and processing values of the infrared radiation registered by the infrared sensor 140 via a connection 302. The connection 302 can be an analog connection or a digital connection. The program enables execution of the soldering process according to a predetermined time temperature profile of at least one of the solder paste beads and the solder pads and the solder pins. The program can be based on a proportional-integral-derivative control algorithm, wherein the values of the infrared radiation are used as a feedback loop data for adjusting the electrical resistive heating. In other words, the program sets the values of current or voltage at the output terminals of the current/voltage source in order to provide the temperature of at least one of the solder paste beads and solder pads and solder pins according to the predetermined time temperature profile throughout the soldering process, wherein the set values of current or voltage are adjusted according to the temperature of at least one solder paste bead.

In yet another embodiment the temperatures of the solder paste beads and/or the solder pins and/or the solder pads are evaluated by registering an infrared emission of metallization elements on the bottom side of the second product being in a thermal contact with the solder paste beads and/or the solder pins and/or the solder pads. The metallization elements can be but not limited to metallization planes, soldering pads, and wiring. The thermal contact can be provided by the metallized electrical via connections and solder pads on the top surface of the second part.

Yet in another embodiment the time temperature profiles of the solder paste beads (solder pins) (solder pads) 110a and 110b (121a and 121b) (104a and 104b) are controlled individually throughout the soldering process. The infrared sensor 140 is a charge-coupled device (CCD) operable for registering separately infrared emission of the metallization 103a and the another metallization 103b. In this case the temperature of the solder paste bead 110a (solder pin 121a) (solder pad 104a) and the temperature of the another solder paste bead 110b (the another solder pin 121b) (the another solder pad 104b) can be assessed independently of each other and at the same time. The mating connector comprises a first electrical resistive heating element and a second electrical resistive heating element. The first electrical resistive heating element is in a thermal contact with the solder pin 121a and the second electrical resistive heating element is in a thermal contact with the another solder pin 121b. The system is operable for generating individually an electrical resistive heating of the solder paste bead 110a (the solder pin 121a, the solder pad 104a) and another electrical resistive heating of the another solder paste bead 110b (the another solder pin 121a, the another solder pad 104b) by sending a first electrical current through the first electrical resistive heating element and sending a second electrical current through the second electrical resistive heating element.

Similar to the aforementioned embodiment the first (second) electrical current is set to provide a first (second) predetermined time temperature profile of the solder paste bead 110a (the another solder paste bead 110b) and/or a first (second) predetermined time temperature profile of the solder pin 121a (the another solder pin 110b) and/or a first (second) predetermined time temperature profile of the solder pad 104a (the another solder pad 104b), wherein the first (second) electrical current is adjusted using the proportional-integral-derivative algorithm, wherein the temperature of the solder paste bead 110a and/or the solder pin 121a and/or solder pad 104a (the another solder paste bead 110b and/or the another solder pin 121b and/or the another solder pad 104b) is used as a feedback loop data for adjusting the first (second) electrical resistive heating.

Figure 3:
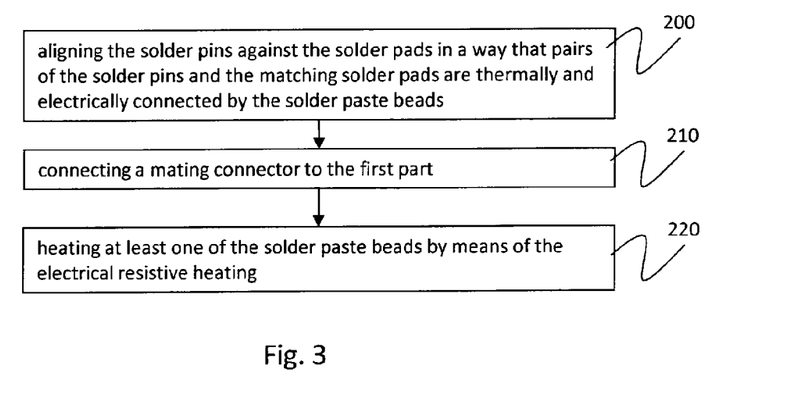
FIG. 3 is a flowchart diagram illustrating a process flow of a method of manufacturing of a product, in accordance with yet another embodiment of the present invention.

FIG. 3 is a flowchart diagram illustrating a process flow of a method of manufacturing of the product. In process block 200 the solder pins 121a and 121b of the first part 120 of the product are aligned against the solder pads 104a and 104b of the second part 100 of the product and in a way that each pair of the solder pin and the matching solder pad 104a and 121a, 104b and 121b is thermally and electrically connected by the matching solder paste bead 110a, 110b. In the process block 210 the mating connector 130 is connected to the first part, wherein the mating connector is operable for providing a part of an electrical conducting path. In the process block 220 at least one of the solder paste beads is heated by means of the electrical resistive heating, wherein the electrical resistive heating is generated by the electrical current flowing through the electrical conducting path, wherein said solder paste bead undergoes the soldering process facilitated by the electrical resistive heating, wherein a temperature of said solder paste bead and/or solder pin connected to said solder paste bead and/or solder pad connected to said solder paste bead is being evaluated, wherein the electrical resistive heating is adjusted according to the temperature of said solder paste bead and/or solder pin connected to said solder paste bead and/or solder pad connected to said solder paste bead. It will be apparent to those skilled in the art that that the process blocks 200 and 210 can be executed in any arbitrary sequence.

Figure 4:
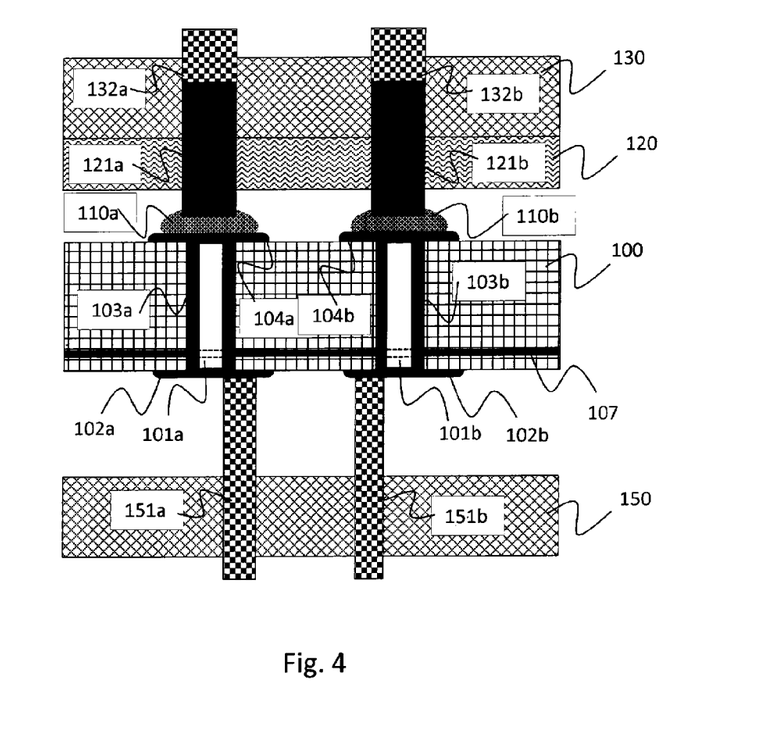
FIG. 4 is a cross-section of a product, a mating connector, and a second mating connector, in accordance with an embodiment of the present invention.

FIG. 4 illustrates a first part 120 of a product aligned against a second part 100 of the product and a system for soldering the first part to the second part. The system comprises a mating connector 130. The mating connector 130 can be connected to the first part 120. The system can further comprise a second mating connector 150. The second connector 150 can be connected to the second part 100. The first part comprises a solder pin 121a and another solder pin 121b. The second part comprises a metallized electrical via connection 101a, another metallized electrical via connection 101b, a solder pad 104a, another solder pad 104b, a top surface, and a bottom surface. The second part can further comprise, a contact pad 102a, another contact pad 102b, and an internal metallization plane 107 between the top surface and the bottom surface. The metallized electrical via connection 101a comprises a hole having an opening on the top surface of the second part and another opening on the bottom surface of the second part. Sidewalls of the hole are covered with a metallization 103a. The another metallized electrical via connection 101b comprises another hole having an opening on the top surface of the second part and another opening on the bottom surface of the second part. Sidewalls of the another hole are covered with another metallization 103b. The opening of the hole on the top surface is covered by a solder pad 104a electrically connected with the metallization 103a. The opening of the another hole on the top surface of the second part is covered by another solder pad 104b electrically connected with the another metallization 103b. The opening of the hole on the bottom surface is covered by the contact pad 102a electrically connected with the metallization 103a. The opening of the another hole on the bottom surface of the second part is covered by the another contact pad 102b electrically connected with the another metallization 103b. The metallization 103a and the another metallization 103b are electrically connected by an internal metallization plane 107. The solder pin 121a matches the solder pad 104a. The another solder pin 121b matches the another solder pad 104b. The solder pad 104a is covered by a solder paste bead 110a being in electrical contact with the solder pad 104a and the solder pin 121a. The another solder pad 104b is covered by another solder paste bead 110b being in electrical contact with the another solder pad 104b and the another solder pin 121b.

The mating connector 130 comprises electrical connectors 132a and 132b. The electrical connector 132a is in an electrical contact with the solder pin 121a and the another electrical connector 132b is in an electrical contact with the another solder pin 121b when the mating connector 130 is connected to the first part 120.

The second mating connector 150 comprises second electrical connectors 151a and 152b. The second electrical connector 151a is in an electrical contact with the contact pad 102a and the another second electrical connector 151b is in an electrical contact with the another contact pad 102b when the second mating connector 150 is connected to the second part 100.

An electrical resistive heating is generated in the solder paste bead 110a when an electrical current flows through an electrical conducting path comprising the electrical connector 132a, the solder pin 121a, the solder paste bead 110a, and the solder pad 104a. The electrical conducting path can further comprise the metallization 103a, the contact pad 102a, and the second electrical connector 151a. The heat generated by the electrical resistive heating facilitates the soldering process of the solder paste bead 110a.

Another electrical resistive heating is generated in the another solder paste bead 110b when another electrical current flows through another electrical conducting path comprising the electrical connector 132b, the solder pin 121b, the solder paste bead 110b, and the solder pad 104b. The another electrical conducting path can further comprise the metallization 103b, the contact pad 102b, and the second electrical connector 151b. The heat generated by the electrical resistive heating facilitates the soldering process of the solder paste bead 110b.

The latter two electrical currents can be different and/or can generate different amounts of heat. This can be of particular advantage when the solder paste beads 110a and 110b (the solder pins 121a and 121b) (the solder pads 104a and 104b) require different time temperature profiles throughout the soldering process. For instance this can be required when the solder paste beads 110a and 110b are made of different solder pastes, which require different time temperature profiles throughout the soldering process. Generation of different amounts of heat in the solder paste beads 110a and 110b can be of particular advantage in an opposite situation, when the same time temperature profiles are required for the solder paste beads 110a and 110b (the solder pins 121a and 121b) (the solder pads 104a and 104b) throughout the soldering process. This situation can occur when the solder paste beads 110a and 110b are of different volumes of solder paste beads. Another exemplary situation is when the solder pins 121a and 121b (the solder pads 104a and 104b) have different heat capacity and/or are in thermal contacts with elements having different heat capacity and/or heat conductivity, or in the other words a thermodynamics of the soldering process of the solder paste bead 110a is different in comparison with a thermodynamics of the soldering process of the another solder paste bead 110b.

Yet another electrical conducting path comprises the electrical connector 132a, the solder pin 121a, the solder paste bead 110a, the solder pad 110a, the another solder pad 104b, the another solder paste bead 110b, the another solder pin 121b, the another electrical connector 132b, wherein the solder pad 104a and the another solder pad 104b can be electrically connected by the metallization 103a, the metallization 103b, and the internal metallization plane 107. Alternatively the system can comprise a third mating connector operable for making an electrical connection between solder the pad 104a and the another solder pad 104b when the dedicated third mating connector is connected to the third part. An electrical current flowing through yet another electrical conducting path generates electrical resistive heating in at least one of the solder paste bead 110a and solder paste bead 110b.

In order to reduce unnecessary/parasitic heating of the mating connector and/or the first part and/or the second part and/or the second mating connector and/or the third mating connector, in one embodiment, the electrical resistance of the solder paste bead(s) is higher than the electrical resistances of other members of the electrical conducting paths comprising the solder paste bead(s) at least at the onset of the soldering process.

Figure 5:
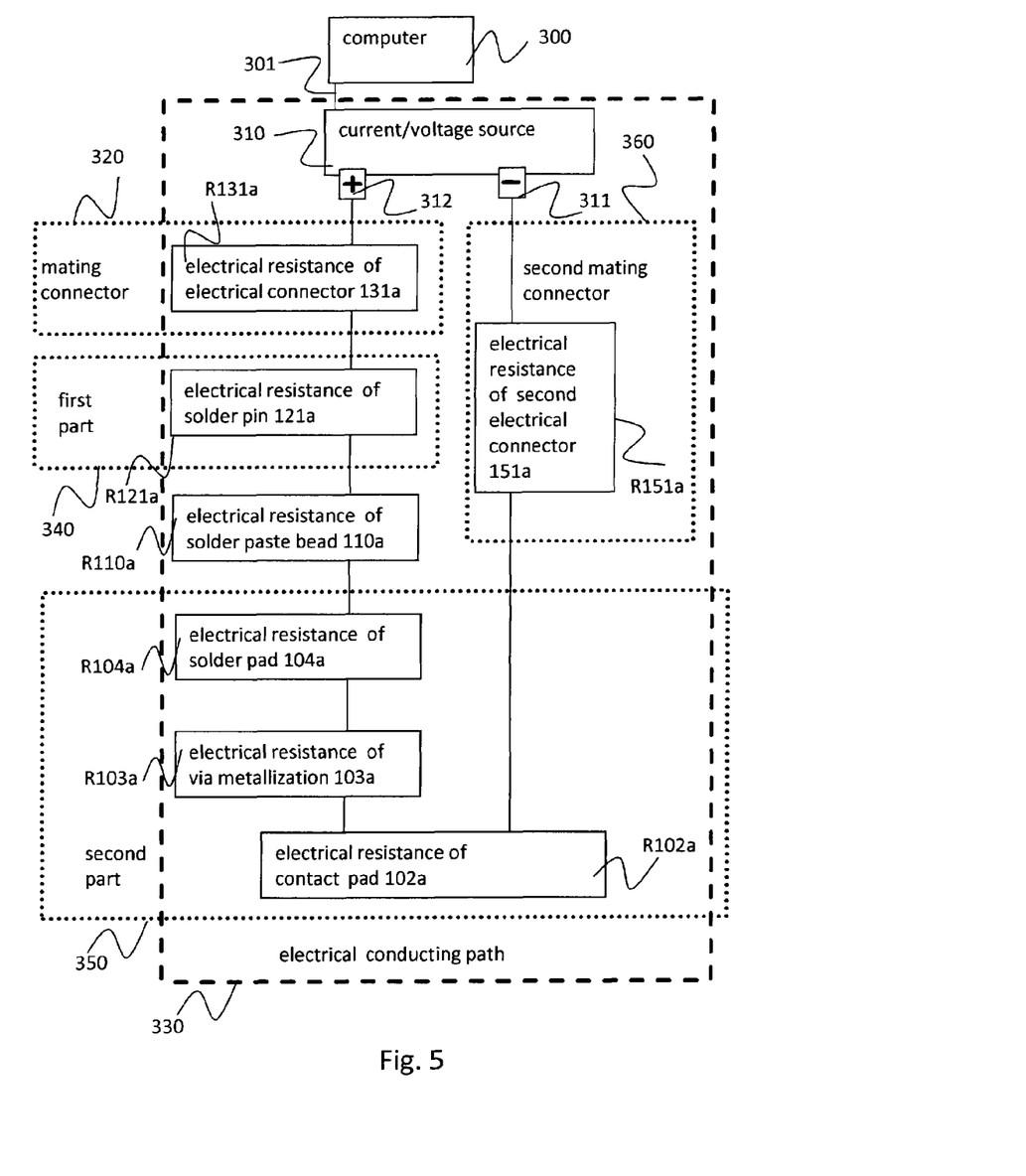
FIG. 5 is an electrical scheme representing an electrical conductive path, in accordance with an embodiment of the present invention.

FIG. 5 illustrates an electrical scheme comprising elements represented on FIG. 4. A closed loop of an electrical conducting path is within a dashed contour 330. Electrical resistors corresponding to components of the mating connector 130 are within a doted contour 320. Electrical resistors corresponding to components the first part 120 are within a doted contour 340. Electrical resistors corresponding to components of the second part 100 are within a doted contour 350. Electrical resistors corresponding to components of the second mating connector 360 are within a doted contour 360. The closed loop of the electrical conducting path comprises the following elements connected in series: a current/voltage source 312, an electrical resistor R131a representing electrical resistance of the electrical connector 131a, an electrical resistor R121a representing electrical resistance of the solder pin 121a, an electrical resistor R110a representing electrical resistance of the solder paste bead 110a, an electrical resistor R104a representing electrical resistance of the solder pad 104a, an electrical resistor R103a representing electrical resistance of the metallization 103a, an electrical resistor R102a representing electrical resistance of the contact pad 102a, and an electrical resistor R151a representing electrical resistance of the second electrical connector 151a. An output terminal 312 of the current/voltage source is connected to the electrical resistor 131a. Another output terminal 311 of the current/voltage source is connected to the electrical resistor 151a.

Figure 6:
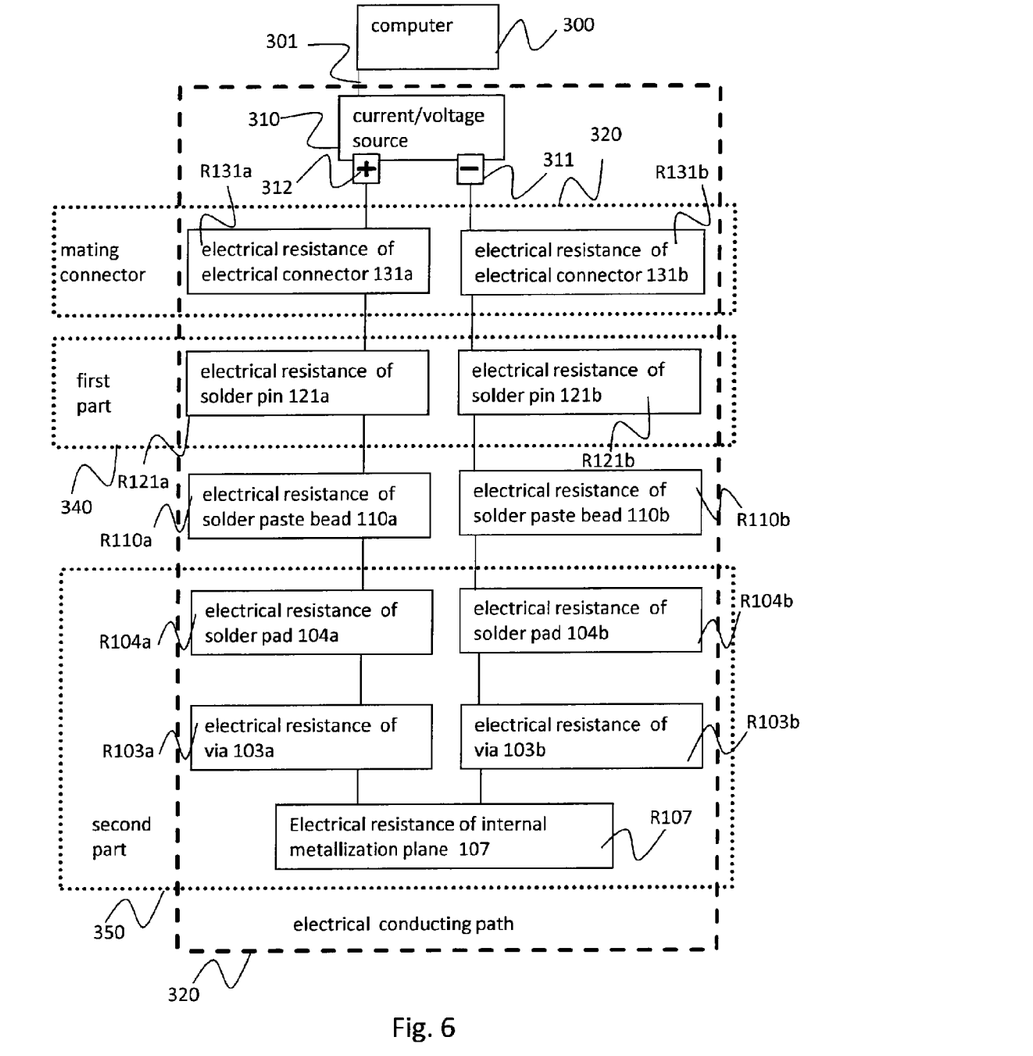
FIG. 6 is an electrical scheme representing an electrical conductive path, in accordance with an embodiment of the present invention.

FIG. 6 illustrates another electrical scheme comprising elements represented on FIG. 4. Another closed loop of another electrical conducting path is within a dashed contour 330. Electrical resistors corresponding to components of the mating connector 130 are within a doted contour 320. Electrical resistors corresponding to components of the first part 120 are within a doted contour 340. Electrical resistors corresponding to components of the second part 100 are within a doted contour 350. The closed loop of the electrical conducting path comprises the following elements connected in series: a current/voltage source 312, an electrical resistor R131a representing electrical resistance of the electrical connector 131a, an electrical resistor R131b representing electrical resistance of the electrical connector 131b, an electrical resistor R121a representing electrical resistance of the solder pin 121a, an electrical resistor R121b representing electrical resistance of the solder pin 121b, an electrical resistor R110a representing electrical resistance of the solder paste bead 110a, an electrical resistor R110b representing electrical resistance of the solder paste bead 110b, an electrical resistor R104a representing electrical resistance of the solder pad 104a, an electrical resistor R104b representing electrical resistance of the solder pad 104b, an electrical resistor R103a representing electrical resistance of the metallization 103a, an electrical resistor R103b representing electrical resistance of the metallization 103b, an electrical resistor R107a representing electrical resistance of the internal metallization plane 107. An output terminal 312 of the current/voltage source is connected to the electrical resistor 131a. Another output terminal 311 of the current/voltage source is connected to the electrical resistor 151a.

In both electrical schemes represented on FIG. 5 and FIG. 6 the current/voltage source 310 is operable for setting a (current) voltage at the output terminals 311 and 312 and measuring a resulting (voltage) current at the output terminals 311 and 312. A computer 300 is connected to the current/voltage source via a connection 301. The computer 300 is operable for sending commands to the current/voltage source to set at the output terminals a (current) voltage value and to send back to the computer the resulting value of (voltage) current at the output terminals 311 and 312. A connection 301 between the computer 300 and the current/voltage source 310 is operable for transmitting the commands. The electrical scheme represented in FIG. 5 and/or the electrical scheme represented in FIG. 6 can further comprise an infrared sensor operable for registering infrared emission of at least one of the solder paste beads 110a and 110b or infrared emission of components being in thermal contact with at least one of the solder paste beads. Details of this approach are already discussed in the embodiments described above.

Figure 7:
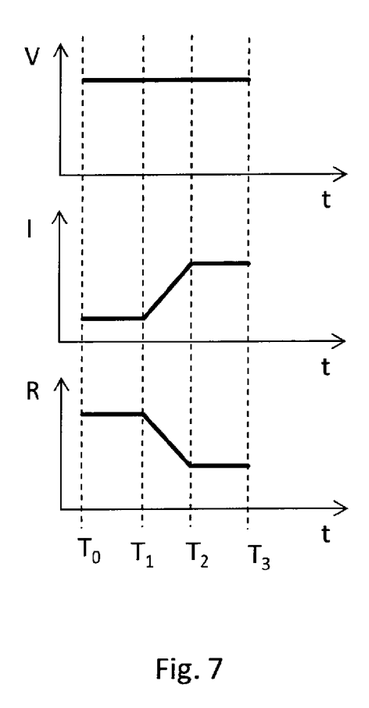
FIG. 7 represents corresponding time dependencies of voltage, current, and electrical resistance during a soldering process, in accordance with an embodiment of the present invention.
Figure 8:
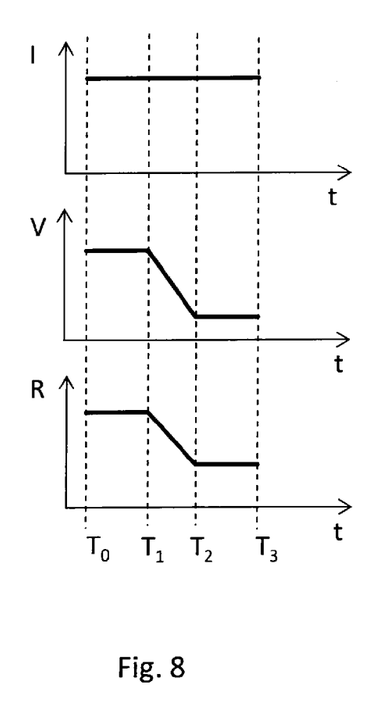
FIG. 8 represents corresponding time dependencies of voltage, current, and electrical resistance during a soldering process, in accordance with an embodiment of the present invention.

The embodiments, wherein the electrical current used for generation of electrical resistive heating flows through one or more solder paste beads enables another elegant way of assessment of the temperature of the solder paste beads. FIG. 7 illustrates an exemplary case when the current/voltage source is programmed to set a constant voltage at the output terminals. The top graph on FIG. 7 illustrates this situation, wherein a voltage value is constant in time. The middle graph on FIG. 7 illustrates resulting electrical current flowing though the electrical conducting path comprising at least one of the solder paste beads. In a time interval $T_0$-$T_1$ the electrical current is constant. In a time interval $T_1$-$T_2$ the electrical current increases. In a time interval $T_2$-$T_3$ the electrical current is constant but higher as it was in the time interval $T_0$-$T_1$. An electrical resistance, derived using Ohm's Law shows an opposite trend as the electrical current. The bottom graph on FIG. 7 illustrates time dependence of the electrical resistance. In the time interval $T_0$-$T_1$ the electrical resistance is constant. In a time interval $T_1$-$T_2$ the electrical current decreases, in a time interval $T_2$-$T_3$ the electrical current is constant but lower as it was in the time interval $T_0$-$T_1$. These graphs can be explained on a basis of observation, wherein an electrical resistance of the solder paste bead starts to decrease at the beginning of the soldering process characterized by an onset of melting and coalescence of solder particles. Therefore the moment T, when the resistance starts to decrease, indicates that the temperature of the solder paste bead(s) has reached a temperature, when the soldering process starts. The moment $T_2$ indicates the end of the soldering process, when the current flowing though the electrical conducting path can be switched off. Electrical resistance monitoring can be an effective feedback loop as well in another case when the current/voltage source is programmed to set a constant current at the output terminals, wherein the constant current flows though the electrical conducting path comprising at least one of the solder paste beads. The top graph on FIG. 8 illustrates this situation, wherein a current value is constant in time. The middle graph on FIG. 8 illustrates resulting voltage at the output terminals of the current/voltage source. In a time interval $T_0$-$T_1$ the voltage is constant. In a time interval $T_1$-$T_2$ the voltage decreases. In a time interval $T_2$-$T_3$ the voltage is constant but lower as it was in the time interval $T_0$-$T_1$. An electrical resistance, derived using Ohm's Law shows the same trend as in a previous case when the voltage was sent constant (bottom graph on FIG. 7). The bottom graph on FIG. 8 illustrates time dependence of the electrical resistance. In the time interval $T_0$-$T_1$ the electrical resistance is constant. In a time interval $T_1$-$T_2$ the electrical current decreases, in a time interval $T_2$-$T_3$ the electrical current is constant but lower as it was in the time interval $T_0$-$T_1$. These two examples illustrated on FIG. 7 and on FIG. 8 clearly show that monitoring of the electrical resistance of the electrical conducting path comprising one or more solder paste beads is an effective technique for monitoring the temperature of the solder paste beads of the electrical conducting path. Moreover this technique does not depend on the settings of the current/voltage source.

Yet in another embodiment the first part is an electrical connector.

Yet in another embodiment the second part is the printed circuit board.

Yet in another embodiment the soldering process is further facilitated by providing a gas above room temperature to the product. This can be done by a heat gun or by placing the product in an oven.

Yet in another embodiment quality of electrical connection between the solder pin and the matching solder pad can be monitored by a time domain reflectometry of the electrical conducting path comprising the solder pin and the matching solder pad electrically connected together by the solder paste bead.

Yet in another embodiment the system can comprise a mechanical fixture for holding together during the soldering process at least two of the following parts: the first part (120), the second part (100), the infrared sensor (140), the mating connector (130), the second mating connector (150).

One embodiment provides for a method for manufacturing a product comprising a first part and a second part. The first part comprises solder pins and the second part comprises solder pads. Each of the solder pins has the matching solder pad. Each of the solder pads is covered by a matching solder paste bead. The method comprises the following steps: aligning the solder pins against the solder pads in a way that each pair of the solder pin and the matching solder pad is thermally and electrically connected by the matching solder paste bead; connecting a mating connector to the first part, wherein the mating connector is operable for providing a part of an electrical conducting path; and heating at least one of the solder paste beads by means of an electrical resistive heating, wherein the electrical resistive heating is generated by an electrical current flowing through the electrical conducting path, wherein said solder paste bead undergoes a soldering process facilitated by the electrical resistive heating, wherein a temperature of the solder paste bead is being evaluated, wherein the electrical resistive heating is adjusted according to the temperature of the solder paste bead.

Another embodiment provides for a system for manufacturing a product comprising a first part and a second part. The first part comprises solder pins and the second part comprises solder pads. Each of the solder pins has the matching solder pad. Each of the solder pads is covered by a matching solder paste bead. The system comprises: means for aligning the solder pins against the solder pads in a way that each pair of the solder pin and the matching solder pad is thermally and electrically connected by the matching solder paste bead; a mating connector, wherein the mating connector is operable for providing a part of an electrical conducting path when the mating connector is connected to the first part, wherein the electrical conducting path is used for a flow of an electrical current, wherein the electrical current is used for generation of an electrical resistive heating, wherein the electrical resistive heating is used to facilitate a soldering process of at least one solder paste bead; means for evaluation of a temperature of the solder paste bead during the soldering process facilitated by the electrical resistive heating; and means for adjusting the electrical resistive heating of the solder paste bead during the soldering process facilitated by the electrical resistive heating according to the temperature of the solder paste beads.

All aforementioned embodiments can further comprise a portion or all of the following features and/or functionalities.

The system can further comprise a second mating connector. The second mating connector comprises second electrical connectors. Each of the second electrical connectors has the matching solder pad. The second mating connector is operable for making electrical connections between the second electrical connectors and the matching solder pads when the second mating connector is connected to the second part.

The mating connector can further comprise electrical connectors. Each of the solder pins has the matching electrical connector. Each of the solder pins is electrically connected to the matching electrical connector when the mating connector is connected to the first part.

The electrical conducting path can comprise the solder pin, the matching solder pad, the solder paste bead electrically connecting the solder pin and the matching solder pad, wherein the electrical resistive heating is generated in the solder paste bead.

The another electrical conducting path can comprise the solder pin, the matching solder pad, the solder paste bead electrically connecting the solder pin and the matching solder pad, the electrical connector electrically connected to the solder pin, wherein the electrical resistive heating is generated in the solder paste bead.

Yet another electrical conducting path can comprise the solder pin, the matching solder pad, the solder paste bead electrically connecting the solder pin and the matching solder pad, the electrical connector electrically connected to the solder pin, and the second electrical connector electrically connected to the solder pad, wherein the electrical resistive heating is generated in the solder paste bead.

Yet another electrical conducting path can comprise the electrical connector electrically connected to the solder pin, the solder pin, the solder paste bead electrically connecting the solder pin and the solder pad, the solder pad, the another solder pad electrically connected to the solder pad, the another solder paste bead electrically connecting the another solder pad and the another solder pin, the another solder pin, and the another electrical connector electrically connected to the another solder pin, wherein the electrical resistive heating is generated in at least one of the solder paste bead and the another solder paste bead.

Yet another electrical conductive path can comprise an electrical resistive heating element, wherein the electrical conductive path comprises the electrical resistive heating element, wherein the electrical resistive heating element is in a thermal contact with at least one of the solder pins when the mating connector is connected to the first part, wherein the electrical resistive heating is generated in the electrical resistive heating element, wherein a heat generated by the electrical resistive heating flows to the solder paste bead via the solder pin being in the thermal contact with the electrical resistive element and in the thermal contact with the solder paste bead.

The temperature of the solder paste bead can be evaluated by measuring an electrical resistance of the electrical conducting path, wherein a decrease in the electrical resistance of the electrical conducting path indicates that (a least one of) the solder paste bead(s) has reached a temperature at which the soldering process begins, wherein solder particles of the solder paste start to melt and to coalesce during onset of the soldering process, wherein the solder paste comprises the metal particles, wherein the melting and the coalescence of the metal particles causes a reduction in an electrical resistance of the solder paste beads.

The second part can be a printed circuit board, wherein the solder pads are on a top side of the printed circuit board, wherein the solder pads have metallized electrical via connections to a bottom side of the printed circuit board, wherein the temperature of the solder paste beads is evaluated on a basis of an infrared emission measurement of the metallized via connections from the bottom side of the printed circuit board.

The heating can be further provided by supplying a gas having a gas temperature above room temperature to the product.

Quality of electrical connection between the solder pin and the matching solder pad can be monitored by a time domain reflectometry of an electrical conducting path comprising the solder pin and the matching solder pad electrically connected together by the solder paste bead.

What is claimed is:

1. A system for manufacturing a product, the system comprising:
    a mating connector connected to solder pins of a first part of the product to provide an electrical conducting path used for a flow of an electrical current, the electrical current used for generation of an electrical resistive heating to facilitate a soldering process wherein the solder pins of the first part are aligned against solder pads of a second part of the product such that for each solder pin, of the solder pins, a corresponding solder pad, of the solder pads, is thermally and electrically connected by a corresponding solder paste bead of a plurality of solder paste beads; and
    a controller to adjust the electrical resistive heating of a solder paste bead, of the plurality of solder paste beads, during the soldering process facilitated by the electrical resistive heating according to a temperature of said solder paste bead, wherein the second part is a printed circuit board, wherein the solder pads are on a top side of the printed circuit board, wherein the solder pads have metallized electrical via connections to a bottom side of the printed circuit board, and wherein the temperature of the solder paste beads is evaluated on a basis of an infrared emission measurement of the metallized via connections from the bottom side of the printed circuit board.

2. The system of claim 1, wherein the mating connector is a first mating connector and wherein the system further comprises a second mating connector, wherein the second mating connector comprises electrical connectors, wherein each of the electrical connectors corresponds to a solder pad, of the solder pads, wherein the second mating connector is operable for making electrical connections between the electrical connectors and their corresponding solder pads based on the second mating connector being connected to the second part of the product.

3. The system of claim 1, wherein the mating connector comprises a plurality of electrical connectors, wherein each of the solder pins corresponds to an electrical connector of the plurality of electrical connectors, wherein each of the solder pins is electrically connected to its corresponding electrical connector based on the mating connector being connected to the first part of the product, wherein the electrical conducting path comprises a solder pin, of the solder pins, the corresponding solder pad corresponding to the solder pin, the corresponding solder paste bead electrically connecting the solder pin and the corresponding solder pad, the corresponding electrical connector electrically connected to the solder pin, and another electrical connector, of the plurality of electrical connectors, electrically connected to the solder pad corresponding to the solder pin, wherein the electrical resistive heating is generated in at least one solder paste bead of the plurality of solder paste beads.

4. The system claim 3, wherein the temperature of said solder paste bead is evaluated by measuring an electrical resistance of the electrical conducting path, wherein a decrease in the electrical resistance of the electrical conducting path indicates that one or more solder paste beads of the plurality of solder paste beads has reached a temperature at which the soldering process begins, wherein solder particles of solder paste start to melt and to coalesce during onset of the soldering process, wherein the solder paste comprises the metal particles, wherein the melting and the coalescence of the metal particles causes a reduction in an electrical resistance of the plurality of solder paste beads.

5. The system of claim 1, wherein the mating connector comprises a plurality of electrical connectors, wherein each of the solder pins corresponds to an electrical connector of the plurality of electrical connectors, wherein each of the solder pins is electrically connected to its corresponding electrical connector based on the mating connector being connected to the first part of the product, wherein the electrical conducting path comprises a first electrical connector, of the plurality of electrical connectors, electrically connected to a first solder pin of the solder pins, a first solder pad corresponding to the first solder pin, a first solder paste bead electrically connecting the first solder pin and the first solder pad, a second solder pad electrically connected to the first solder pad, a second solder paste bead electrically connecting the second solder pad and a second solder pin of the solder pins, the second solder pin, and a second electrical connector, of the plurality of electrical connectors, electrically connected to the second solder pin.

6. The system of claim 1, wherein the mating connector comprises an electrical resistive heating element, wherein the electrical conducting path comprises the electrical resistive heating element, wherein the electrical resistive heating element is in a thermal contact with at least one of the solder pins based on the mating connector being connected to the first part of the product, wherein the electrical resistive heating is generated in the electrical resistive heating element, wherein a heat generated by the electrical resistive heating flows to the solder paste bead via its corresponding solder pin, wherein the corresponding solder pin is in the thermal contact with the electrical resistive element and in the thermal contact with the solder paste bead.

7. The system of claim 1, wherein quality of electrical connection between a solder pin of the solder pins and its corresponding solder pad is monitored by a time domain reflectometry of the electrical conducting path comprising the solder pin and the corresponding solder pad electrically connected together by the corresponding solder paste bead.

8. The system of claim 1, further comprising a sensor to sense temperature of the solder paste bead.

9. A method of manufacturing a product, the method comprising:
aligning solder pins of a first part of the product against solder pads of a second part of the product such that for each solder pin, of the solder pins, a corresponding solder pad, of the solder pads, is thermally and electrically connected by a corresponding solder paste bead of a plurality of solder paste beads;
connecting a mating connector to the solder pins of the first part of the product to provide an electrical conducting path; and
heating a solder paste bead of the plurality of solder paste beads by an electrical resistive heating, wherein the electrical resistive heating is generated by an electrical current flowing through the electrical conducting path, wherein said solder paste bead undergoes a soldering process facilitated by the electrical resistive heating, wherein a temperature of said solder paste bead is being evaluated, wherein the electrical resistive heating is adjusted according to the temperature of said solder paste bead, wherein the second part is a printed circuit board, wherein the solder pads are on a top side of the printed circuit board, wherein the solder pads have metallized electrical via connections to a bottom side of the printed circuit board, and wherein the temperature of the solder paste beads is evaluated on a basis of an infrared emission measurement of the metallized via connections from the bottom side of the printed circuit board.

10. The method of claim 9, wherein the electrical conducting path comprises the solder pin, the corresponding solder pad, the corresponding solder paste bead electrically connecting the solder pin and the corresponding solder pad, and an electrical connector electrically connected to the solder pin, wherein the mating connector comprises a plurality of electrical connectors, wherein each solder pin of the solder pins corresponds to an electrical connector of the plurality of electrical connectors and is electrically connected to the corresponding electrical connector based on the mating connector being connected to the first part of the product, wherein the electrical resistive heating is generated in the solder paste bead.

11. The method of claim 10, wherein the temperature of said solder paste bead is evaluated by measuring an electrical resistance of the electrical conducting path, wherein a decrease in the electrical resistance of the electrical conducting path indicates that one or more solder paste beads of the plurality of solder paste beads has reached a temperature at which the soldering process begins, wherein solder particles of solder paste start to melt and to coalesce during onset of the soldering process, wherein the solder paste comprises the metal particles, wherein the melting and the coalescence of the metal particles causes a reduction in an electrical resistance of the plurality of solder paste beads.

12. The method of claim 9, wherein the mating connector comprises a plurality of electrical connectors, wherein each of the solder pins corresponds to an electrical connector of the plurality of electrical connectors, wherein each of the solder pins is electrically connected to its corresponding electrical connector based on the mating connector being connected to the first part of the product, wherein the electrical conducting path comprises a first electrical connector, of the plurality of electrical connectors, electrically connected to a first solder pin of the solder pins, a first solder pad corresponding to the first solder pin, a first solder paste bead electrically connecting the first solder pin and the first solder pad, a second solder pad electrically connected to the first solder pad, a second solder paste bead electrically connecting the second solder pad and a second solder pin of the solder pins, the second solder pin, and a second electrical connector, of the plurality of connectors, electrically connected to the second solder pin, and wherein the electrical resistive heating is generated in at least one solder paste bead of the plurality of solder paste beads.

13. The method of claim 9, wherein the mating connector comprises an electrical resistive heating element, wherein the electrical conducting path comprises the electrical resistive heating element, wherein the electrical resistive heating element is in a thermal contact with at least one of the solder pins based on the mating connector being connected to the first part of the product, wherein the electrical resistive heating is generated in the electrical resistive heating element, wherein a heat generated by the electrical resistive heating flows to the solder paste bead via its corresponding solder pin, wherein the corresponding solder pin is in the thermal contact with the electrical resistive element and in the thermal contact with the solder paste bead.

14. The method of claim 9, wherein the heating is further provided by supplying a gas having a gas temperature above room temperature to the product.

15. The method of claim 9, wherein quality of electrical connection between a solder pin of the solder pins and its corresponding solder pad is monitored by a time domain reflectometry of the electrical conducting path comprising the solder pin and the corresponding solder pad electrically connected together by the corresponding solder paste bead.

16. The method of claim 9, further comprising sensing temperature of the solder paste bead.

* * * * *